US011366019B2

(12) United States Patent
Yee

(10) Patent No.: US 11,366,019 B2
(45) Date of Patent: Jun. 21, 2022

(54) ENHANCED AMBIENT TEMPERATURE DETECTION

(71) Applicant: X Development LLC, Mountain View, CA (US)

(72) Inventor: Phillip Yee, San Francisco, CA (US)

(73) Assignee: X Development LLC, Mountain View, CA (US)

( * ) Notice: Subject to any disclaimer, the term of this patent is extended or adjusted under 35 U.S.C. 154(b) by 528 days.

(21) Appl. No.: 16/456,093

(22) Filed: Jun. 28, 2019

(65) Prior Publication Data

US 2020/0408607 A1    Dec. 31, 2020

(51) Int. Cl.
*G01K 1/14* (2021.01)
*G01K 7/01* (2006.01)
(Continued)

(52) U.S. Cl.
CPC ............... *G01K 1/14* (2013.01); *G01K 7/01* (2013.01); *G01K 7/02* (2013.01); *G01K 7/18* (2013.01);
(Continued)

(58) Field of Classification Search
CPC .. G01K 1/14; G01K 7/01; G01K 7/02; G01K 7/18; G01K 7/22; H05K 1/147;
(Continued)

(56) References Cited

U.S. PATENT DOCUMENTS 5,152,610 A * 10/1992 Hallett .................. E04H 4/14
374/208
5,416,728 A * 5/1995 Rudzewicz ............ G01K 1/20
701/1

(Continued)

FOREIGN PATENT DOCUMENTS

EP         2541157         1/2013
WO      WO2016028295      2/2016

OTHER PUBLICATIONS

International Preliminary Report on Patentability in International Appln No. PCT/US2019/061453, dated Jan. 6, 2022, 8 pages.

*Primary Examiner* — Lisa M Caputo
*Assistant Examiner* — Philip L Cotey
(74) *Attorney, Agent, or Firm* — Fish & Richardson P.C.

(57) ABSTRACT

Methods, systems, and apparatus, including computer programs encoded on computer-storage media, for a device with improved ambient temperature detection. In some implementations, a device includes a housing that forms an interior space, and the housing includes an exterior surface, a pass-through region that defines a through-hole between the interior space to the exterior surface, and a recess at the exterior surface adjacent to the pass-through hole. The device includes a printed circuit board disposed within the interior space of the plastic housing. The device includes a flexible printed circuit substrate including a first end region that is connected to the printed circuit board that is disposed within the interior space of the housing, a second end region at an opposite end of the flexible printed circuit substrate than the first end region, that is disposed in the recess at the exterior surface of the housing, and a middle region that passes through the through-hole between the first end region and the second end region. The device includes a temperature sensor disposed at the second end region of the flexible printed circuit substrate in the recess at the exterior surface of the housing. The device includes a protective layer that is disposed on at least a portion of the exterior surface of the housing and that covers the recess and the through-hole.

16 Claims, 2 Drawing Sheets

(51) Int. Cl.
*G01K 7/02* (2021.01)
*G01K 7/18* (2006.01)
*G01K 7/22* (2006.01)
*H05K 1/14* (2006.01)
*H05K 1/18* (2006.01)
*H05K 5/00* (2006.01)
*H05K 5/02* (2006.01)
*H05K 5/03* (2006.01)

(52) U.S. Cl.
CPC ............... *G01K 7/22* (2013.01); *H05K 1/147* (2013.01); *H05K 1/189* (2013.01); *H05K 5/0004* (2013.01); *H05K 5/0247* (2013.01); *H05K 5/03* (2013.01); *H05K 2201/10151* (2013.01)

(58) Field of Classification Search
CPC .... H05K 1/189; H05K 5/0004; H05K 5/0247; H05K 5/03; H05K 2201/10151
See application file for complete search history.

(56) References Cited

U.S. PATENT DOCUMENTS

| | | | | |
|---|---|---|---|---|
| 7,785,004 | B2* | 8/2010 | Kautz | G01K 17/20 73/866.5 |
| 9,310,098 | B2* | 4/2016 | Buescher | G05D 23/1931 |
| 9,404,815 | B2* | 8/2016 | Arunasalam | G01K 13/02 |
| 9,671,296 | B2* | 6/2017 | Niederberger | H04M 1/72454 |
| 10,697,810 | B1* | 6/2020 | Tjaden, Jr. | G01L 19/0084 |
| 2006/0262830 | A1* | 11/2006 | Yim | G01K 1/143 374/E1.019 |
| 2014/0367475 | A1* | 12/2014 | Fadell | G06F 3/042 236/1 C |
| 2014/0376591 | A1* | 12/2014 | Geisler | G01K 7/01 374/137 |
| 2016/0245706 | A1* | 8/2016 | Zivkovic | G01K 7/427 |
| 2017/0316228 | A1* | 11/2017 | Campbell | G06F 21/62 |
| 2018/0035947 | A1* | 2/2018 | Paetsch | A61B 5/6817 |
| 2018/0059694 | A1* | 3/2018 | Rezny | F24F 11/89 |
| 2019/0059152 | A1* | 2/2019 | Boozer | H05K 5/064 |
| 2019/0341760 | A1* | 11/2019 | Okura | H05K 5/02 |
| 2020/0103457 | A1* | 4/2020 | Ghouse | H05K 1/0209 |

* cited by examiner

ENHANCED AMBIENT TEMPERATURE DETECTION

TECHNICAL FIELD

The present specification relates to ambient temperature detection.

BACKGROUND

Traditionally, printed circuit board (PCB) mounted temperature sensors must wait until the interior temperature of a device, where the PCB is located, has reached equilibrium with the ambient environment before it can take an accurate measurement. This lag time, the time needed for the interior of the device to reach temperature equilibrium, can depend on a number of factors and can take anywhere from a few minutes to over 30 minutes. Regardless of the exact lag time, due to, for example, the manufacturing tolerances that exist for physical dimensions of parts, air gaps within the device housing, and/or the insulation properties of the materials used for the device housing, the lag time will be significant even with the use of thermal interface materials (TIM). Additionally, the interior temperature of a device may never reach equilibrium with the ambient environment due to, for example, heat being generated by internal components of the device, or heat being dissipated by internal components of the device.

SUMMARY

In some implementations, a device having a temperature sensor placed externally with respect to the device's housing is able to accurately detect the ambient temperature with substantially reduced lag time. The temperature sensor can be secured to an internal printed circuit board through a flexible printed circuit substrate, and may be covered with a protective layer. Placing the temperature sensor externally with respect to the device's housing significantly reduces the lag time in detecting the ambient temperature. The protective layer does not substantially affect the lag time due to the thinness of the layer, due to the material properties of the protective layer such as its thermal conductivity, or due to the combination of the protective layer's thinness and material properties.

In one aspect, a device includes a housing that forms an interior space, and that includes (i) an exterior surface, (ii) a pass-through region that defines a through-hole between the interior space to the exterior surface, and (ii) a recess at the exterior surface adjacent to the pass-through hole; a printed circuit board disposed within the interior space of the housing; a flexible printed circuit substrate including (i) a first end region that is connected to the printed circuit board that is disposed within the interior space of the housing, (ii) a second end region at an opposite end of the flexible printed circuit substrate than the first end region, that is disposed in the recess at the exterior surface of the housing, and (iii) a middle region that passes through the through-hole between the first end region and the second end region; a temperature sensor disposed at the second end region of the flexible printed circuit substrate in the recess at the exterior surface of the housing; and a protective layer that is disposed on at least a portion of the exterior surface of the housing and that covers the recess and the through-hole.

In some implementations, the temperature sensor is disposed on a first side of the flexible printed circuit; and the first side of the flexible printed circuit faces the protective layer.

In some implementations, the temperature sensor is in contact with the protective layer.

In some implementations, the recess at the exterior surface of the housing has a deeper section between two higher sections.

In some implementations, a first higher section of the two higher sections of the recess is positioned adjacent to the pass-through hole; a second higher section of the two higher sections of the recess is positioned away from the pass-through hole; and a portion of the second end region of the flexible printed circuit substrate is secured to the second higher section of the two higher sections of the recess.

In some implementations, the temperature sensor is disposed at the second end region of the flexible printed circuit substrate in the deeper section of the recess at the exterior surface of the housing.

In some implementations, the temperature sensor is disposed on a first side of the flexible printed circuit at the second end region of the flexible printed circuit substrate above the deeper section of the recess at the exterior surface of the housing.

In some implementations, a gap is formed between a second side of the flexible printed circuit at the second end region of the flexible printed circuit substrate and the deeper section of the recess at the exterior surface of the housing.

In some implementations, the recess at the exterior surface of the housing has a width that is slightly wider than the width of the second end region of the flexible printed circuit substrate and a length that is slightly longer than the length of the second end region of the flexible printed circuit substrate.

In some implementations, the pass-through region of the housing defines the through-hole such that the through-hole is substantially perpendicular with respect to the protective layer.

In some implementations, the protective layer is a sticker.

In some implementations, the protective layer is formed from a polymer.

In some implementations, the polymer is biaxially-oriented polyethylene terephthalate.

In some implementations, the polymer is epoxy.

In some implementations, the protective layer is formed from a metalized polymer.

In some implementations, the metalized polymer is biaxially-oriented polyethylene terephthalate having a deposit layer of metal thereon.

In some implementations, the protective layer is formed from a metal.

In some implementations, the protective layer is secured to the at least portion of the exterior surface of the housing through an adhesive.

In some implementations, the housing contains an upper housing unit having a top exterior surface and a lower housing unit; the top housing unit is secured to the lower housing unit; and the protective layer is disposed on at least a portion of the top exterior surface.

In another aspect a method includes placing a printed circuit board within an interior space of a housing that includes (i) an exterior surface, (ii) a pass-through region that defines a through-hole between the interior space to the exterior surface, and (ii) a recess at the exterior surface adjacent to the pass-through hole; placing (i) a first end region of a flexible printed circuit substrate within the interior space of the housing, (ii) a second end region of the flexible printed circuit substrate at an opposite end of the flexible printed circuit substrate than the first end region and in the recess at the exterior surface of the housing, and (iii)

a middle region of the flexible printed circuit substrate through the through-hole between the first end region and the second end region; placing a temperature sensor at the second end region of the flexible printed circuit substrate in the recess at the exterior surface of the housing; securing the first end region of the flexible printed circuit substrate to the printed circuit board; and covering the recess and the through-hole with a protective layer.

Advantageous implementations can include one or more of the following features.

The device provides for improved ambient temperature detection by having a temperature sensor placed externally with respect to the device's housing. By having the temperature sensor placed externally with respect to the device's housing, the device is able to take an accurate ambient temperature measurement with substantially reduced lag time. A protective layer which covers the temperature sensor does not substantially affect the lag time due to the thinness of the protective layer, due to the thermal conductivity of material included in the layer, or due to a combination of the protective layer's thinness and material properties.

The device provides for more accurate ambient temperature measurements. In having the temperature sensor placed externally with respect to the device's housing, the device can obtain ambient temperature measurements that are unaffected, or substantially unaffected, by any heat generated by internal components of the device or by any heat dissipated by internal components of the device. In addition, by having the temperature sensor placed externally with respect to the device's housing instead of within the housing, the device can obtain ambient temperature measurements that are unaffected by, for example, manufacturing variation in the device's housing, or the manufacturing tolerances for the device's housing. The device can also obtain more accurate ambient temperature measurements by not relying on any thermal interface materials between the temperature sensor and the device's housing due to, for example, the tendency of many thermal interface materials to migrate overtime.

The details of one or more embodiments of the invention are set forth in the accompanying drawings and the description below. Other features and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Figure 1B:
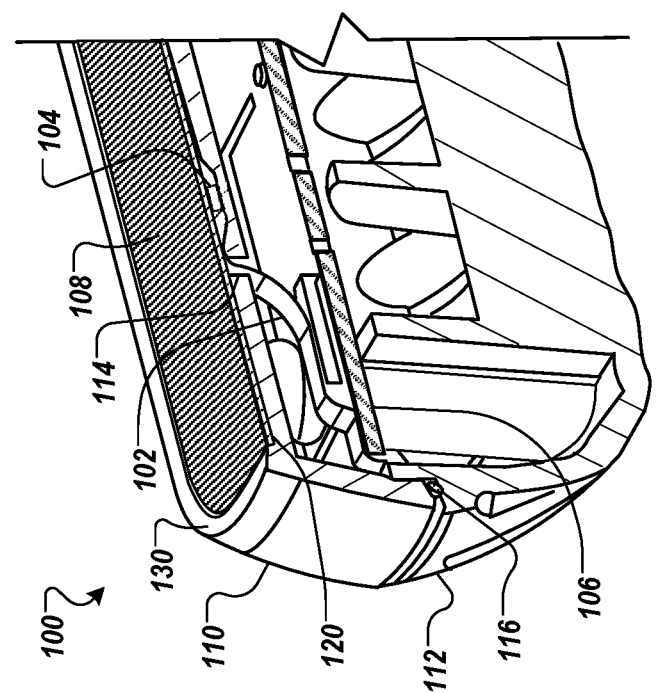
FIGS. 1A-1B are diagrams showing an example device for enhanced ambient temperature detection.
Figure 1A:
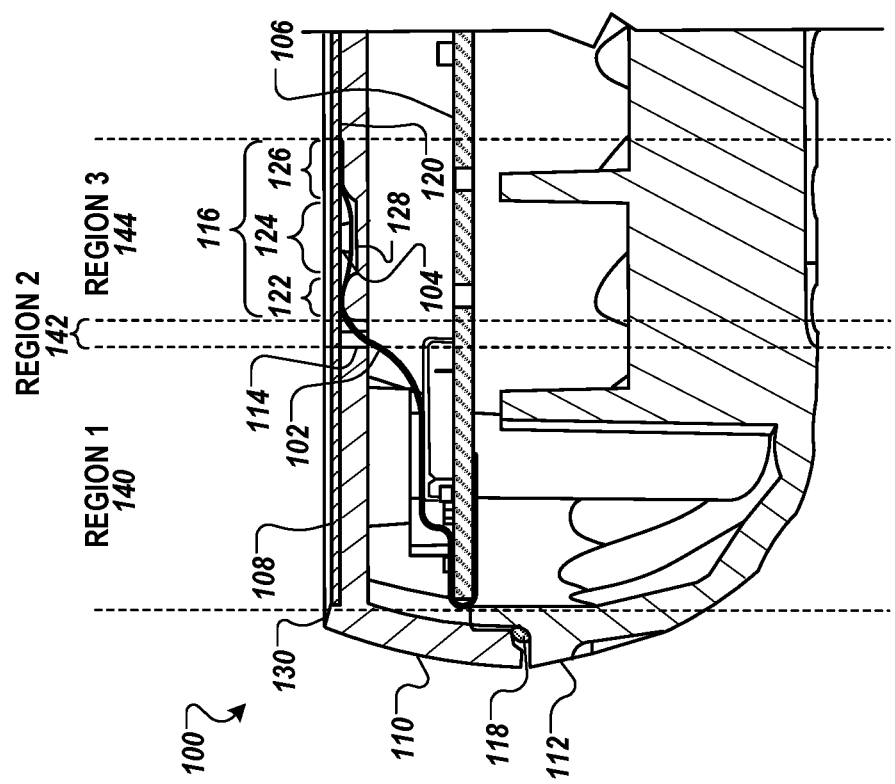

FIGS. 1A-B are diagrams showing an example device 100 with improved ambient temperature detection. FIG. 1A shows a side, cutaway view of the device 100. FIG. 1B shows a perspective, cutaway view of the device 100.

The device 100 includes a temperature sensor 104 positioned externally with respect to the device 100's housing. By having the temperature sensor 104 positioned externally, the device 100 is able to quickly and accurately measure the ambient temperature of the environment in which the device 100 is located. By covering the temperature sensor 104 with a layer 108, the device 100 can protect the temperature sensor 104 and the device 100's internal components while maintaining the benefit of improved ambient temperature detection.

The device 100 may be a computing device, such as a smart phone, a tablet, a smart watch, a laptop computer, a desktop computer, a wearable device, an Internet-of-Things (IoT) device, etc. The device 100 may be a mobile phone or a cell phone. The device 100 may be global positioning system (GPS) tracker. The device 100 may be an emergency position indicator radio beacon (EPIRB), a personal locator beacon (PLB), or a personal AIS beacon (PAB). Where the device 100 is an EPIRB, a PLB, or a PAB, the device 100 may include a GPS unit. The device 100 may be part of a vehicle. Where the device 100 is part of a vehicle, the housing of the device 100 may be formed by one or more external panels of the vehicle. Where the device 100 is part of a vehicle, the housing of the device 100 may be secured to an external surface of the vehicle, e.g., front bumper, rear bumper, undercarriage, etc., or embedded into an external surface of the vehicle. The device 100 may be a geotechnical instrument. The device 100 may be an oceanography instrument.

As will be discussed in more detail below, the device 100 may be a sealed device, such that it is water resistant, waterproof, dust resistant, and/or dust proof.

The temperature sensor 104 may be a thermistor, a resistance temperature detector (RTD), a thermocouple, or a semiconductor-based sensor. The temperature sensor 104 may be a surface mounted device (SMD).

The techniques disclosed in this document can reduce the time for a device to accurately measure the ambient temperature. The device 100 provides for enhanced ambient temperature detection by, for example, having the temperature sensor 104 placed externally with respect to the device 100's housing. With the temperature sensor 104 placed externally with respect to the device 100's housing, the device 100 is able to take an accurate ambient temperature measurement with substantially reduced lag time. The layer 108 does not substantially affect the lag time due to the thinness of the layer 108, e.g., 0.1-0.5 mm, 0.20-0.30 mm, 0.25 mm, etc., due to the thermal conductivity of material included in the layer 108, or due to a combination of the layer 108's thinness and material properties.

The techniques disclosed can improve the accuracy of ambient temperature measurements. In having the temperature sensor 104 placed externally with respect to the device 100's housing, the device 100 can obtain ambient temperature measurements that are unaffected, or substantially unaffected, by any heat generated by internal components of the device 100, or by any heat dissipated by internal components of the device 100. These internal components may include, for example, CPUs, graphics cards, GPUs, disk drives, heat sinks. In addition, by having the temperature sensor 104 placed externally with respect to the device 100's housing instead of within the housing, the device 100 can obtain ambient temperature measurements that are unaffected by, for example, manufacturing variation in the device 100's housing, or the manufacturing tolerances for the device 100's housing. The device 100 can also obtain more accurate ambient temperature measurements by not relying on any TIM between the temperature sensor and the device 100's housing due to, for example, the tendency of many TIMs to migrate overtime.

As shown in FIGS. 1A-1B, the device 100 includes a upper housing 110 having a pass-through region that defines a through-hole 114, a lower housing 112, a seal 118 between the upper housing 110 and the lower housing 112, a PCB 106 placed within an interior chamber formed from the upper housing 110 and the lower housing 112, a flexible printed circuit (FPC) 102, the temperature sensor 104 mounted on the FPC 102, and the layer 108.

The upper housing 110 and the lower housing 112 may be formed from a polymer or a metal. The upper housing 110 and the lower housing 112 may be formed from the same type material. For example, the upper housing 110 and the lower housing 112 are both from the same type of polymer, from the same type of metal, etc. The upper housing 110 and the lower housing 112 may be formed from different materials. For example, the upper housing 110 may be formed from a metal, whereas the lower housing 112 may be formed from a polymer. Where the upper housing 110 and/or the lower housing 112 are made from one or more polymers, e.g. one or more thermoplastics, the upper housing 110 and/or the lower housing 112 may be manufactured through injection molding. Where the upper housing 110 and/or the lower housing 112 are made from one or more metals, the upper housing 110 and/or the lower housing 112 may be manufactured through casting.

The upper housing 110 may be secured to the lower housing 112 through one or more clips. The upper housing 110 may be secured to the lower housing 112 through one or more fasteners. The one or more fasteners may be, for example, one or more screws, one or more bolts with corresponding nuts, etc. The upper housing 110 may be secured to the lower housing 112 through a combination of one or more clips and one or more fasteners. A seal 118 may be placed between the upper housing 110 and the lower housing 112. The seal 118 may be locked in place by the shape or design of the upper housing 110 and/or the lower housing 112 when the upper housing 110 is secured to the lower housing 112. The seal 118 may be continuous around the perimeter of the device 100 or around the perimeter of the lower housing 112. The seal 118 may be formed from rubber. The seal 118 may be formed from a polymer. The seal 118 may be formed from silicon. As an example, the seal 118 may be an O-ring.

The upper housing 110 includes the through-hole 114. As shown, the through-hole 114 is substantially perpendicular with respect to a substantially planar top surface 120 of the upper housing 110 and extends from the interior chamber formed from the combination of the upper housing 110 and the lower housing 112 to the exterior surface of the upper housing 110, specifically the top surface 120. The through-hole 114 corresponds with a second region 142 such that through-hole 114 is located within the region 142 and the length of the through-hole 114 is equal to, substantially equal to, or slightly less than the width of the region 142.

The through-hole 114 may be formed during the manufacturing process of the upper housing 110. For example, the through-hole 114 may be formed during an injection molding process while manufacturing the upper housing 110 out of plastic. As another example, the through-hole 114 may be formed during a casting process while manufacturing the upper housing 110 out of metal. The through-hole 114 may be formed after the upper housing 110 has been manufactured. For example, the through-hole 114 may be formed through drilling or milling, cutting or sawing, heat staking, ultrasound techniques, etc.

The through-hole 114 may be rectangular in shape having dimensions larger than the width and depth of at least part of the FPC 102 so as to accommodate at least part of the FPC 102. The through-hole 114 may have a width that is slightly larger than the width of the FPC 102. For example, the width of the through-hole 114 may be 101% to 150% of the FPC 102's width, 101% to 125% of the FPC 102's width, 110% to 150% of the FPC 102's width, 110% to 125% of the FPC 102's width, etc. The through-hole 114 may have a length that is slightly larger than the depth of the FPC 102. For example, the length of the through-hole 114 may be 101% to 150% of the FPC 102's depth, 101% to 125% of the FPC 102's depth, 110% to 150% of the FPC 102's depth, 110% to 125% of the FPC 102's depth, etc. The through-hole 114 may have a length that is moderately larger than the depth of the FPC 102. For example, the length of the through-hole 114 may be 126% to 300% of the FPC 102's depth, 151% to 300% of the FPC 102's depth, 126% to 200% of the FPC 102's depth, 126% to 200% of the FPC 102's depth, 151% to 200% of the FPC 102's depth, etc. The through-hole 114 may have a length that is significantly larger than the depth of the FPC 102. For example, the length of the through-hole 114 may be 200% to 2000% of the FPC 102's depth, 300% to 2000% of the FPC 102's depth, 200% to 1000% of the FPC 102's depth, 300% to 1000% of the FPC 102's depth, etc.

In some implementations, the through-hole 114 is not substantially perpendicular with respect to the top surface 120 of the upper housing 110. In these implementations, the through-hole 114 may be formed in the upper housing 110 at an angle in order to, for example, eliminate one or more stress points on the FPC 102 and/or to reduce the impact of one or more stress points on the FPC 102. For example, the through-hole 114 may be formed at a 15-75 degree angle, a 25-65 degree angle, a 30 to 60 degree angle, a 40 to 50 degree angle, a 45 degree angle, etc.

The FPC 102 includes a flexible substrate. The substrate may be formed from one or more layers of polyimide, polyethylene terephthalate (PET), polyethylene naphthalate (PEN), polyether ether ketone (PEEK), or polyester film. The substrate may be formed from one or more layers of flexible glass. The substrate may be formed from one or more layers of flexible silicon. A number of wires/conductors may be embedded in the substrate. One or more electrical components may be embedded in the substrate. The substrate and any wires/conductors (e.g., copper wires/conductors) and/or electrical components embedded in the substrate may be coated with a material (e.g., an additional layer of polyimide film).

The FPC 102 and the substrate of the FPC 102 include a first end region having a first end, a middle region, and a second end region having a second end. The first end region of the FPC 102 corresponds with a first region 140 such that the first end region of the FPC 102 is located within the first region. The FPC 102 may be secured to the PCB 106 at the first end region within the interior chamber formed from the upper housing 110 and the lower housing 112. As an example, the first end region of the FPC 102 may be secured to the PCB 106 through one or more connectors, pins, or fingers. As another example, the first end region of the FPC 102 may be secured to the PCB 106 using through-hole technology. As another example, in some implementations, the FPC 102 and the PCB 106 are part of a single rigid-flex circuit where the FPC 102 is a flexible portion of the rigid-flex circuit and the PCB 106 is a rigid portion of the rigid-flex circuit.

The middle region of the FPC 102 corresponds with the second region 142 such that the middle region of the FPC 102 is located within the second region 142. The middle region of the FPC 102 passes through the through-hole 114 of the upper housing 110. During manufacture of the device 100, the first end region of the FPC 102 may be passed through the through-hole 114 so that the middle region of the FPC 102 passes through the through-hole 114. Similarly, during manufacture of the device 100, the second end region of the FPC 102 may be passed through the through-hole 114 so that the middle region of the FPC 102 passes through the through-hole 114.

The second end region of the FPC 102 corresponds with a third region 144 such that the second end region is located within the third region 144. The second end region of the FPC 102 is located at an opposite end of the FPC 102 than the first end region. The temperature sensor 104 is mounted on the second end region of the FPC 102 on a first side of the FPC 102 away from the upper housing 110. Mounting the temperature sensor 104 on the first side of the FPC 102 away from the upper housing 110 allows the temperature sensor 104 to directly contact the layer 108 once the layer 108 is secured to the top surface 120 of the upper housing 110. Having the temperature sensor 104 come to into direct contact with the layer 108 allows the temperature sensor 104 to measure the ambient temperature with substantially reduced lag time due to, for example, the thinness of the layer 108, e.g. 0.1-0.5 mm, 0.20-0.30 mm, 0.25 mm, etc., due to the thermal conductivity of material included in the layer 108, or due to a combination of the layer 108's thinness and material properties.

The temperature sensor 104 may be mounted to the FPC 102 through surface mount technology (SMT). Accordingly, the FPC 102 may include the temperature sensor 104. The temperature sensor 104 may be mounted to the FPC 102 using through-hole technology.

As shown in FIG. 1A, adjacent to the through-hole 114 is a recess 116 to accommodate the second end region of the FPC 102. The recess 116 also corresponds with the third region 144 such that the recess 116 is located within the third region 144 and the recess 116 has a length that is equal to, substantially equal, or slightly less than the width of the third region 144. The recess 116 includes a first section 122, a second section 124, and a third section 126. The second section 124 is provided between the first section 122 and the third section 126. The first section 122, the second section 124, and the third section 126 may have varying depths with respect to the top surface 120 of the upper housing 110. The recess 116 may be formed during the manufacturing process of the upper housing 110, e.g., during injection molding, during casting, etc. The recess 116 may be formed after the upper housing 110 has been manufactured, e.g. through milling. The recess 116 may be formed with the formation of the through-hole 114.

All or part of the first section 122 of the recess 116 may have a depth that is equivalent, substantially equivalent, or slightly larger than the depth of the FPC 102. This may allow, for example, a portion of the FPC 102 in the first section 122 of the recess 116 to be in contact with the upper housing 110, or an adhesive applied to a portion of the upper housing 110, and the layer 108 once the layer 108 is applied to the top surface 120 of the upper housing 110. In some implementations, a portion of the external surface of the upper housing 110 corresponding with the first section 122 may have an adhesive applied to it so as to adhere at least a portion of the second end region of the FPC 102 to the upper housing 110.

As shown in FIG. 1A, the recess 116, specifically the first section 122 of the recess 116, may eliminate a sharp angled surface that would have otherwise been formed between the upper housing 110 and the through-hole 114 in order to provide a curved surface for contact with the FPC 102. The curved surface created by the first section 122 of the recess 116 lessens the likelihood of damage to the FPC 102, such as a crease forming in the FPC 102, by preventing the FPC 102 from coming into contact with at least one sharp angled surface at a stress point.

As shown in FIG. 1A, the second section 124 of the recess 116 has a depth larger than both the first section 122 and the third section 126. The depth of the second section 124 accommodates both the height of temperature sensor 104 and the depth of the FPC 102 such that it is equivalent, substantially equivalent to, or larger than the height of the temperature sensor 104 combined with the depth of the FPC 102. As shown, the depth of the second section 124 is larger than the height of the temperature sensor 104 combined with the depth of the FPC 102, resulting in the formation of an air gap 128. The air gap 128 is formed between a portion of the FPC 102 and the upper housing 110 due to the inherent properties of the FPC 102 which results in an upwards spring force when the layer 108 brings the temperature sensor 104 into the plane of the top surface 120 of the upper housing 110.

The air gap 128 can serve as a protective measure for the temperature sensor 104 in case an external force is exerted on the device 100 at or near the second section 124 of the recess 116. For example, if the device 100 is dropped on a rock such that a portion of the layer 108 comes into contact with the rock and the portion of the layer 108 corresponds with the recess 116, the temperature sensor 104 can be pushed deeper into the second section 124 of the recess 116 before the corresponding portion of the FPC 102 comes into contact with the upper housing 110. In addition, as the temperature sensor 104 is pushed deeper into the second section 124 of the recess 116, the spring force generated by the FPC 102 will increase, thereby helping to counteract the force of the drop, preventing the corresponding portion of the FPC 102 from coming into contact with the upper housing 110, and/or deaccelerating, or lessening the acceleration of, the temperature sensor 104 before the corresponding portion of the FPC 102 comes into contact with the upper housing 110. Accordingly, the air gap 128 can decrease the likelihood of damage to the temperature sensor 104 and the FPC 102, and/or can lessen the amount of damage to the temperature sensor 104 and the FPC 102.

All or part of the third section 126 of the recess 116 may have a depth that is equivalent, substantially equivalent, or slightly larger than the depth of the FPC 102. This may allow, for example, a portion of the FPC 102 in the third section 126 of the recess 116 to be in contact with the upper housing 110, or an adhesive applied to a portion of the upper housing 110, and the layer 108 once the layer 108 is applied to the top surface 120 of the upper housing 110. A portion of the external surface of the upper housing 110 corresponding with the third section 126 may have an adhesive applied to it so as to adhere at least a portion of the second end region of the FPC 102 to the upper housing 110 including the second end of the FPC 102. In implementations where an adhesive is applied to the external surface of the upper housing 110 corresponding with the third section 122 in order to adhere at least a portion of the FPC 102 to the upper housing 110, the portion of the external surface of the upper housing 110 corresponding with third section 122 may not have an adhesive applied to it so as to leave a portion of the second end region of the FPC 102, including the second end of the FPC 102, floating.

The layer 108 is applied to the top surface 120 of the upper housing 110 and contacts the temperature sensor 104. The layer 108 covers the through-hole 114 and the recess 116. The layer 108 may additionally cover fasteners used, for example, to secure the upper housing 110 to the lower housing 112. The layer 108 may, in addition to the seal 118, help to seal the device 100 so as to aid in making the device waterproof, water resistant, dust proof, and/or dust resistant. The layer 108 may be secured to the top surface 120 of the upper housing 110 with adhesive, with an adhesive layer that may be part of the layer 108, and/or with one or more fasteners.

The device 100 may have a ridge 130 in the upper housing 110 which defines the area of the upper housing 110 meant to receive the layer 108. The layer 108 may be formed and/or shaped to fit the area defined by the ridge 130. For example, the layer 108 may be formed and/or shaped through die cutting.

The layer 108 may include a one or more layers of different material. The layer 108 may include an adhesive layer. The layer 108 may be a sticker having multiple material layers with at least one adhesive layer. The layer 108 may include a polymer layer. The polymer may be a polycarbonate. The polymer may be biaxially-oriented polyethylene terephthalate. The polymer may be an epoxy. The layer 108 may include a metalized polymer layer. The metalized polymer layer may be biaxially-oriented polyethylene terephthalate having a deposit layer of metal. The deposit layer of metal may be aluminum. The layer 108 may include a metal layer and/or a metal alloy layer. The metal may be, for example, aluminum, copper, nickel, iron, or titanium. The metal alloy may be, for example, an alloy containing aluminum, copper, nickel, iron, or titanium (e.g., steel, stainless steel, brass, etc.).

Despite certain materials not having a very high thermal conductivity such as certain plastics, the temperature sensor 104 may still obtain ambient temperature measurements without substantial lag time due to the thinness of the layer 108, e.g., 0.1-0.5 mm, 0.20-0.30 mm, 0.25 mm, etc.

In some implementations, the layer 108 does not necessarily need to be thin, e.g., may be thicker than 0.25 mm, may be thicker than 0.30 mm, may be thicker than 0.5 mm, etc. In these implementations, the layer 108 may include a layer of material having high thermal conductivity such as, for example, copper, aluminum, brass, etc.

In some implementations, in place of the layer 108, the temperature sensor 104, the second end region of the FPC 102 including the temperature sensor 104, the through-hole 114, and/or the recess 116 are sealed. In these implementations, the temperature sensor 104, the second end region of the FPC 102 including the temperature sensor 104, the through-hole 114, and/or the recess 116 may be sealed with epoxy. In these implementations, any fasteners may be separately sealed. In these implementations, any fasteners may be separately sealed with epoxy.

In manufacturing the device 100, there may be a specific order to how the elements are put together. For example, the seal 118 and the PCB 106 may be first placed on or secured to the lower housing 112. Next, the first end region of the FPC 102 is passed through the through-hole 114 before being secured to the PCB 106. Alternatively, the first end region of the FPC 102 is secured to the PCB 106 and the second end region of the FPC 102 is passed through the through-hole 114 of the upper housing 110. The upper housing 110 is then secured to the lower housing 112. Finally, the layer 108 is secured to the top surface 120 of the upper housing 110. The temperature sensor 104 is likely already mounted to the FPC 102 as part of the FPC 102 before the start of this process. However, in some implementations, the temperature sensor 104 may be mounted to the FPC 102 later such as, for example, after the middle region of the FPC 102 passes through the through-hole 114.

Figure 2:
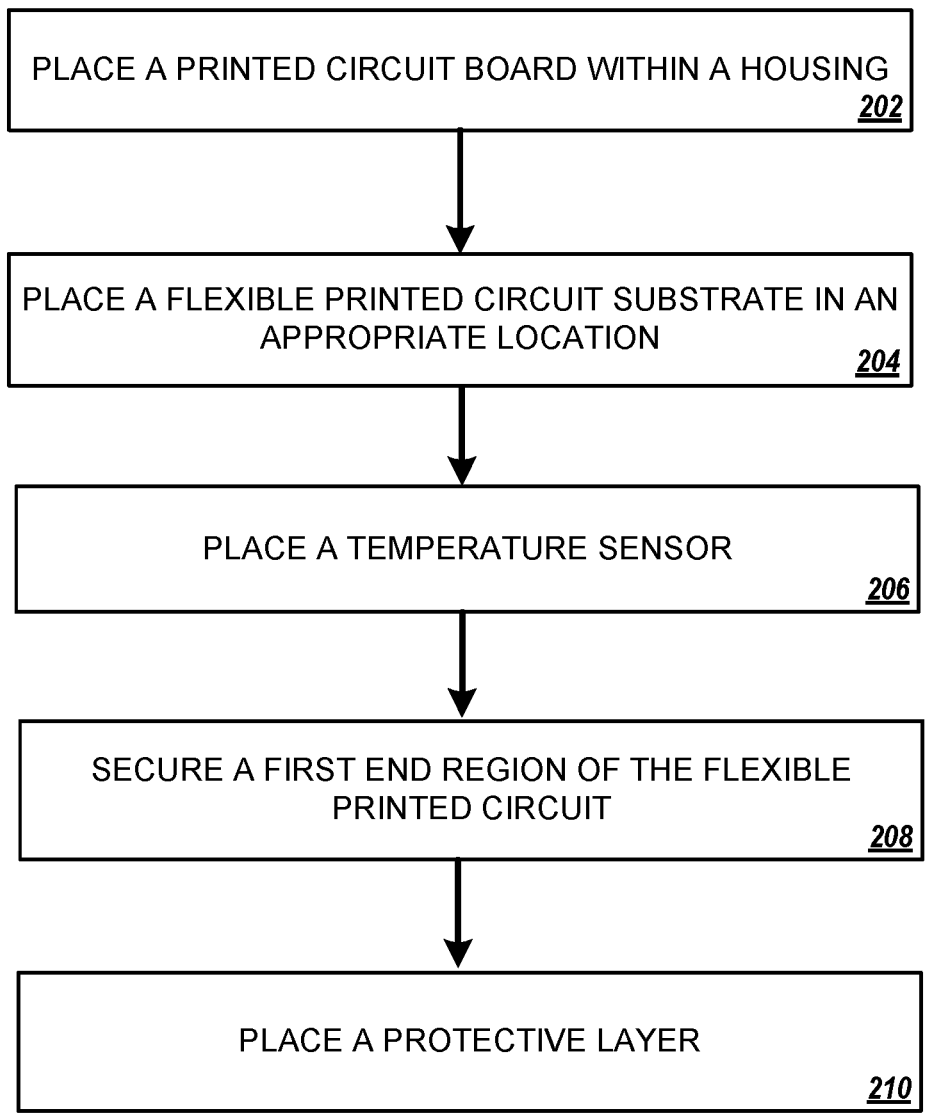
FIG. 2 is a flowchart illustrating an example of a process for manufacturing a device enhanced ambient temperature detection.

FIG. 2 is an example process 200 for manufacturing a device with improved ambient temperature detection. The process 200 can be a process for manufacturing the device 100 described herein.

The process 200 includes placing a printed circuit board within a housing (202). As an example, with respect to FIGS. 1A-1B, the printed circuit board may be the PCB 106. As an example, with respect to FIGS. 1A-1B, the housing may be the combination of the upper housing 110 with lower housing 112, and the interior space may be interior chamber formed when the upper housing 110 is joined to the lower housing 112. As an example, with respect to FIGS. 1A-1B, the housing may include the top surface 120. As an example, with respect to FIGS. 1A-1B, the housing may include a pass-through region that defines the through-hole 114 and may include the recess 116.

The process 200 includes placing a flexible printed circuit substrate in an appropriate location (204). As an example, with respect to FIGS. 1A-1B, the flexible printed circuit substrate may be the substrate of the FPC 102. As an example, with respect to FIGS. 1A-1B, the flexible printed circuit substrate may include the first end region of the FPC 102 substrate that corresponds with the first region 140, the middle region of the FPC 102 substrate that corresponds with the second region 142, and the second end region of the FPC 102 substrate that corresponds with the third region 144.

The process 200 includes placing a temperature sensor (206). As an example, with respect to FIGS. 1A-1B, the temperature sensor may be the temperature sensor 104. As an example, the temperature sensor may be placed at the second end region of the FPC 102 substrate in the recess 116 of the upper housing 110.

The process 200 includes securing a first end region of the flexible printed circuit substrate (208). As an example, with respect to FIGS. 1A-1B, the first end region of the flexible printed circuit substrate may be the first end region of the FPC 102 substrate that corresponds with the first region 140. As an example, with respect to FIGS. 1A-1B, the first end region may be secured to the PCB 106 through one or more connectors, pins, or fingers. As another example, with respect to FIGS. 1A-1B, the first end region of the flexible printed circuit substrate may be secured to the PCB 106 using through-hole technology. As another example, in some implementations, the flexible printed circuit, which includes the flexible printed circuit substrate, and the printed circuit board are part of a single rigid-flex circuit. In this example, the flexible printed circuit is a flexible portion of the rigid-flex circuit and the printed circuit board is a rigid portion of the rigid-flex circuit.

The process 200 includes placing a protective layer (210). As an example, with respect to FIGS. 1A-1B, the protective layer may be the layer 108. As an example, with respect to FIGS. 1A-1B, the protective layer may cover the temperature sensor 104, the recess 116, and/or the through-hole 114.

A number of implementations have been described. Nevertheless, it will be understood that various modifications may be made without departing from the spirit and scope of the disclosure. For example, various forms of the flows shown above may be used, with steps re-ordered, added, or removed.

To provide for interaction with a user, embodiments of the invention can be implemented on a device having a display device, e.g., a CRT (cathode ray tube) or LCD (liquid crystal display) monitor, for displaying information to the user and a keyboard and a pointing device, e.g., a mouse, touch screen, trackpad, or a trackball, by which the user can provide input to the device. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Particular embodiments of the invention have been described. Other embodiments are within the scope of the following claims. For example, the steps recited in the claims can be performed in a different order and still achieve desirable results.

What is claimed is:

1. A device comprising:
    a housing that forms an interior space, and that includes (i) an exterior surface, (ii) a pass-through region that defines a through-hole between the interior space to the exterior surface, and (iii) a recess at the exterior surface adjacent to the through-hole;
    a printed circuit board disposed within the interior space of the housing;
    a flexible printed circuit substrate including (i) a first end region that is connected to the printed circuit board that is disposed within the interior space of the housing, (ii) a second end region at an opposite end of the flexible printed circuit substrate than the first end region, that is disposed in the recess at the exterior surface of the housing, and (iii) a middle region that passes through the through-hole between the first end region and the second end region;
    a temperature sensor disposed at the second end region of the flexible printed circuit substrate in the recess at the exterior surface of the housing; and
    a protective layer that is disposed on at least a portion of the exterior surface of the housing and that covers the recess and the through-hole, wherein the protective layer comprises a sticker, comprises epoxy, or is formed from a metallized polymer, or is formed from a metal.

2. The device of claim 1, wherein:
    the temperature sensor is disposed on a first side of the flexible printed circuit; and
    the first side of the flexible printed circuit faces the protective layer.

3. The device of claim 1, wherein the temperature sensor is in contact with the protective layer.

4. The device of claim 1, wherein the recess at the exterior surface of the housing has a deeper section between two higher sections.

5. The device of claim 4, wherein:
    a first higher section of the two higher sections of the recess is positioned adjacent to the through-hole;
    a second higher section of the two higher sections of the recess is positioned away from the through-hole; and
    a portion of the second end region of the flexible printed circuit substrate is secured to the second higher section of the two higher sections of the recess.

6. The device of claim 4, wherein the temperature sensor is disposed at the second end region of the flexible printed circuit substrate in the deeper section of the recess at the exterior surface of the housing.

7. The device of claim 4, wherein the temperature sensor is disposed on a first side of the flexible printed circuit at the second end region of the flexible printed circuit substrate above the deeper section of the recess at the exterior surface of the housing.

8. The device of claim 7, wherein a gap is formed between a second side of the flexible printed circuit at the second end region of the flexible printed circuit substrate and the deeper section of the recess at the exterior surface of the housing.

9. The device of claim 1, wherein the recess at the exterior surface of the housing has a width that is slightly wider than the width of the second end region of the flexible printed circuit substrate and a length that is slightly longer than the length of the second end region of the flexible printed circuit substrate.

10. The device of claim 1, wherein the pass-through region of the housing defines the through-hole such that the through-hole is substantially perpendicular with respect to the protective layer.

11. The device of claim 1, wherein the protective layer is formed from a polymer.

12. The device of claim 11, wherein the polymer is biaxially-oriented polyethylene terephthalate.

13. The device of claim 1, wherein the metalized polymer is biaxially-oriented polyethylene terephthalate having a deposit layer of metal thereon.

14. The device of claim 1, wherein the protective layer is secured to the at least portion of the exterior surface of the housing through an adhesive.

15. The device of claim 1, wherein:
    the housing contains an upper housing unit having a top exterior surface and a lower housing unit;
    the top housing unit is secured to the lower housing unit; and
    the protective layer is disposed on at least a portion of the top exterior surface.

16. A method comprising:
    placing a printed circuit board within an interior space of a housing that includes (i) an exterior surface, (ii) a pass-through region that defines a through-hole between the interior space to the exterior surface, and (iii) a recess at the exterior surface adjacent to the through-hole;
    placing (i) a first end region of a flexible printed circuit substrate within the interior space of the housing, (ii) a second end region of the flexible printed circuit substrate at an opposite end of the flexible printed circuit substrate than the first end region and in the recess at the exterior surface of the housing, and (iii) a middle region of the flexible printed circuit substrate through the through-hole between the first end region and the second end region;
    placing a temperature sensor at the second end region of the flexible printed circuit substrate in the recess at the exterior surface of the housing;
    securing the first end region of the flexible printed circuit substrate to the printed circuit board; and covering the recess and the through-hole with a protective layer, wherein the protective layer comprises a sticker, comprises epoxy, or is formed from a metallized polymer, or is formed from a metal.

* * * * *